(12) United States Patent
Ubbesen et al.

(10) Patent No.: US 10,218,319 B2
(45) Date of Patent: Feb. 26, 2019

(54) RADIO FREQUENCY (RF) AMPLIFIERS WITH VOLTAGE LIMITING USING NON-LINEAR FEEDBACK

(71) Applicant: Qorvo US, Inc., Greensboro, NC (US)

(72) Inventors: Lars Sandahl Ubbesen, Aalborg (DK); Bjarne Moller-Jensen, Sulsted (DK); Bjarne Petersen, Pandrup (DK); Søren Deleuran Laursen, Vestbjerg (DK); Michael Nielsen, Vodskov (DK)

(73) Assignee: Qorvo US, Inc., Greensboro, NC (US)

(*) Notice: Subject to any disclaimer, the term of this patent is extended or adjusted under 35 U.S.C. 154(b) by 0 days.

(21) Appl. No.: 15/368,992

(22) Filed: Dec. 5, 2016

(65) Prior Publication Data
US 2017/0230012 A1 Aug. 10, 2017

Related U.S. Application Data

(60) Provisional application No. 62/293,391, filed on Feb. 10, 2016.

(51) Int. Cl.
*H03F 1/34* (2006.01)
*H03F 1/52* (2006.01)
(Continued)

(52) U.S. Cl.
CPC .............. *H03F 1/52* (2013.01); *H03F 1/34* (2013.01); *H03F 3/19* (2013.01); *H03G 7/005* (2013.01);
(Continued)

(58) Field of Classification Search
CPC ..... H03F 1/34; H03F 1/05; H03F 3/68; H03F 2200/126; H03F 1/52
(Continued)

(56) References Cited

U.S. PATENT DOCUMENTS 3,092,729 A * 6/1963 Cray .................. H03K 5/02
327/220
3,372,344 A * 3/1968 Hafler .................. H03F 3/3091
330/110
(Continued)

OTHER PUBLICATIONS

Carrara, Francesco et al., "A Methodology for Fast VSWR Protection Implemented in a Monolithic 3-W 55% PAE RF CMOS Power Amplifier," IEEE Journal of Solid-State Circuits, vol. 43, No. 9, Sep. 2008, IEEE, pp. 2057-2066.
(Continued)

*Primary Examiner* — Steven J Mottola
(74) *Attorney, Agent, or Firm* — Withrow & Terranova, P.L.L.C.

(57) ABSTRACT

Radio Frequency (RF) amplifiers with voltage limiting using non-linear feedback are presented herein. According to one aspect, an RF amplifier comprises an amplifier circuit having an input terminal and an output terminal and a non-linear feedback circuit having an input terminal and an output terminal. The input terminal of the non-linear feedback circuit is connected to the output terminal of the amplifier circuit and the output terminal of the non-linear feedback circuit is connected to the amplifier circuit to reduce the gain of the amplifier circuit when an RF voltage swing present at the input terminal of the non-linear feedback circuit exceeds a predefined threshold. In one embodiment, the output terminal of the non-linear feedback circuit is connected to the input terminal of the amplifier circuit. In another embodiment, the output terminal of the non-linear feedback circuit is connected to a bias circuit of the amplifier circuit.

22 Claims, 9 Drawing Sheets

(51) Int. Cl.
  *H03F 3/19* (2006.01)
  *H03G 7/00* (2006.01)
  *H03G 7/08* (2006.01)
  *H03G 11/00* (2006.01)

(52) U.S. Cl.
  CPC ............... *H03G 7/08* (2013.01); *H03G 11/00* (2013.01); *H03F 2200/126* (2013.01); *H03F 2200/408* (2013.01); *H03F 2200/411* (2013.01); *H03F 2200/426* (2013.01); *H03F 2200/451* (2013.01)

(58) Field of Classification Search
  USPC .............................. 330/98, 99, 100, 110, 298
  See application file for complete search history.

(56) References Cited

U.S. PATENT DOCUMENTS

| | | |
|---|---|---|
| 5,264,806 A | 11/1993 | Kobayashi |
| 5,646,573 A * | 7/1997 | Bayruns ................... H03F 1/08 250/214 A |
| 5,710,523 A | 1/1998 | Kobayashi |
| 6,459,340 B1 * | 10/2002 | Apel ........................ H03F 1/52 330/110 |
| 7,218,175 B1 | 5/2007 | Kobayashi |

OTHER PUBLICATIONS

Karoui, Walid et al., "An Adaptive Protection Circuit for Power Amplifier Ruggedness Improvement," 2005 IEEE Radio Integrated Circuits Symposium, Jun. 2005, IEEE, pp. 433-436.

Scuderi, Angelo et al., "A VSWR-Protected Silicon Bipolar RF Power Amplifier With Soft-Slope Power Control," IEEE Journal of Solid-State Circuits, vol. 40, No. 3, Mar. 2005, pp. 611-621.

Van Bezooijen, André et al., "Ruggedness Improvement by Protection," 2006 Bipolar/BiCMOS Circuits and Technology Meeting (IEEE BCTM 14.4), Oct. 2006, IEEE, 4 pages.

Yamamoto, Kazuya et al., "A 3.2-V Operation Single-Chip Dual-Band AlGaAs/GaAs HBT MMIC Power Amplifier with Active Feedback Circuit Technique," IEEE Journal of Solid-State Circuits, vol. 35, No. 8, Aug. 2000, pp. 1109-1120.

* cited by examiner

RADIO FREQUENCY (RF) AMPLIFIERS WITH VOLTAGE LIMITING USING NON-LINEAR FEEDBACK

RELATED APPLICATIONS

The present application claims priority to U.S. Provisional Patent Application Ser. No. 62/293,391, filed Feb. 10, 2016, the disclosure of which is incorporated herein by reference in its entirety.

FIELD OF THE DISCLOSURE

The present disclosure relates to Radio Frequency (RF) amplifiers.

BACKGROUND

Voltage limiting is used in Radio Frequency (RF) amplifiers to maintain ruggedness and limit output power into subsequent stages. Typically, voltage limiters are inserted in the signal path before and/or after amplifier stages. To limit the strong RF signal effectively, these limiters need to be physically large. These large devices are not practical in terms of die size and parasitic loading.

SUMMARY

The present disclosure relates to the use of non-linear feedback around one or more amplifier stages. The non-linear feedback reduces the amplifier gain when the output Radio Frequency (RF) voltage swing exceeds a threshold. The devices in the feedback path can have moderate sizes. With the application of the method of the present disclosure, a power amplifier design passes the most stringent costumer requirements for ruggedness with a low area overhead.

Those skilled in the art will appreciate the scope of the present disclosure and realize additional aspects thereof after reading the following detailed description in association with the accompanying drawings.

According to one aspect of the present disclosure, a Radio Frequency (RF) amplifier comprises an amplifier circuit having an input terminal and an output terminal and a non-linear feedback circuit having an input terminal and an output terminal. The input terminal of the non-linear feedback circuit is coupled to the output terminal of the amplifier circuit and the output terminal of the non-linear feedback circuit is coupled to the amplifier circuit to reduce gain of the amplifier circuit when an RF voltage swing present at the input terminal of the non-linear feedback circuit exceeds a predefined threshold.

In one embodiment, the non-linear feedback circuit operates to limit the output of the amplifier circuit to a maximum RF voltage swing, operates to reduce the gain of the amplifier circuit to zero, or operates to turn the amplifier circuit off.

In one embodiment, the output terminal of the non-linear feedback circuit is coupled to the input terminal of the amplifier circuit.

In one embodiment, the output terminal of the non-linear feedback circuit is coupled to a bias circuit of the amplifier circuit.

In one embodiment, the non-linear feedback circuit comprises a diode branch comprising at least one diode or diode-connected Bi-polar Junction Transistor (BJT) or Field-Effect Transistor (FET).

In one embodiment, the non-linear feedback circuit provides feedback via the output terminal of the non-linear feedback circuit when the RF voltage swing present at the input terminal of the non-linear feedback circuit exceeds the turn-on voltage of the diode branch.

In one embodiment, the non-linear feedback circuit is Alternating Current (AC)-coupled to the amplifier circuit.

In one embodiment, the non-linear feedback circuit is Direct Current (DC)-coupled to the amplifier circuit.

According to another aspect of the present disclosure, a Radio Frequency (RF) amplifier comprises a plurality of amplification stages connected in series, each stage comprising an amplifier circuit having an input terminal and an output terminal, wherein an input terminal of a subsequent amplification stage is coupled to an output terminal of a prior amplification stage, and a non-linear feedback circuit having an input terminal and an output terminal. The input terminal of the non-linear feedback circuit is coupled to an output terminal of one of the plurality of amplification stages and the output terminal of the non-linear feedback circuit is coupled to the amplification circuit of a another of the plurality of amplification stages to reduce gain of the amplification circuit of the other amplification stage when an RF voltage swing present at the input terminal of the non-linear feedback circuit exceeds a predefined threshold.

In one embodiment, the non-linear feedback circuit limits the output of the RF amplifier to a maximum RF voltage swing.

In one embodiment, the non-linear feedback circuit reduces the gain of the amplification circuit of the other amplification stage to zero or turns the amplifier circuit of the other amplification stage off.

In one embodiment, the output terminal of the non-linear feedback circuit is coupled to the input terminal of the other amplification stage.

In one embodiment, the output terminal of the non-linear feedback circuit controls a switch coupled to the input terminal of one of the plurality of amplification stages.

In one embodiment, the switch operates to electrically isolate the input terminal of the amplification stage.

In one embodiment, the switch operates to electrically couple the input terminal of the amplification stage to the output terminal of the amplification stage.

In one embodiment, another output terminal of the non-linear feedback circuit is coupled to the input terminal of another one of the plurality of amplification stages.

In one embodiment, the output terminal of the non-linear feedback circuit is coupled to a bias circuit of the other amplification stage.

In one embodiment, the non-linear feedback circuit comprises a diode branch comprising at least one diode or diode-connected Bi-polar Junction Transistor (BJT) or Field-Effect Transistor (FET).

In one embodiment, the non-linear feedback circuit provides feedback via the output terminal of the non-linear feedback circuit when the RF voltage swing present at the input terminal of the non-linear feedback circuit exceeds the turn-on voltage of the diode branch.

In one embodiment, the non-linear feedback circuit is Alternating Current (AC)-coupled to the amplifier circuit.

In one embodiment, the non-linear feedback circuit is Direct Current (DC)-coupled to the amplifier circuit.

In one embodiment, the output terminal of the non-linear feedback circuit is connected to a plurality of the plurality of amplification stages.

In one embodiment, the output terminal of the non-linear feedback circuit is coupled to all of the plurality of amplification stages.

In one embodiment, the non-linear feedback circuit comprises a plurality of input terminals being coupled to output terminals of a plurality of the amplification stages.

BRIEF DESCRIPTION OF THE DRAWINGS

The accompanying drawing figures incorporated in and forming a part of this specification illustrate several aspects of the disclosure and, together with the description, serve to explain the principles of the disclosure.

DETAILED DESCRIPTION

The present disclosure relates to the use of non-linear feedback around one or more amplifier stages. The non-linear feedback reduces the amplifier gain when the output Radio Frequency (RF) voltage swing exceeds a threshold. The devices in the feedback path can have moderate sizes. With the application of the method of the present disclosure, a power amplifier design passes the most stringent costumer requirements for ruggedness with a low area overhead.

Figure 1:
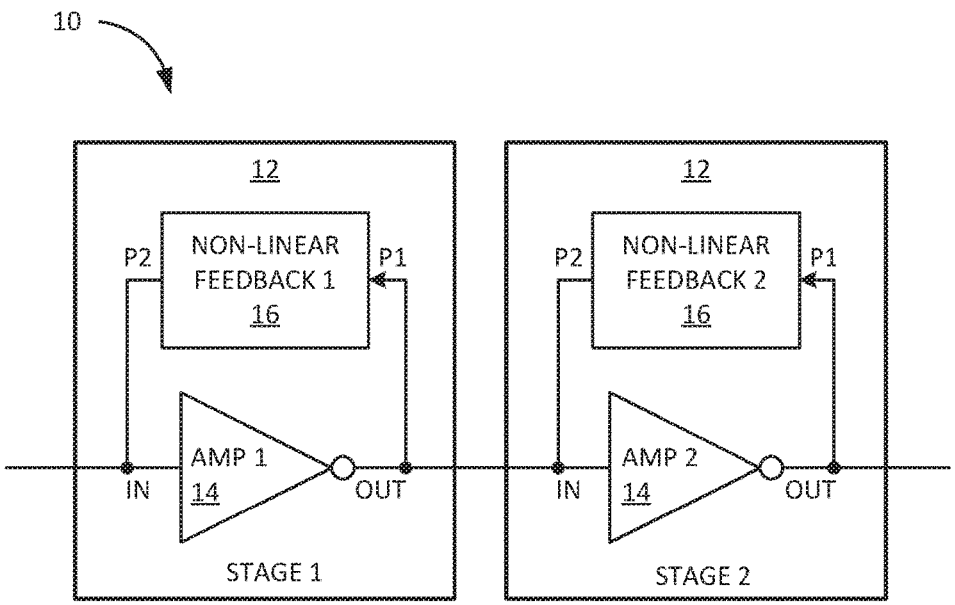
FIG. 1 is a diagram illustrating exemplary non-linear feedback applied to each stage of a multi-stage amplifier according to an embodiment of the present disclosure.

FIG. 1 is a diagram illustrating exemplary non-linear feedback applied to each stage of a multi-stage amplifier according to an embodiment of the present disclosure. In one embodiment, an RF amplifier 10 includes one or more amplification stages 12, each stage having an amplifier circuit 14 having an input terminal and an output terminal and a non-linear feedback circuit 16 having an input terminal and an output terminal. The input and output terminals of the feedback element 16 (and other feedback elements described herein) are labeled "P1" and "P2" respectively. The input terminal of the non-linear feedback circuit 16 is connected to the output terminal of the amplifier circuit 14 and the output terminal of the non-linear feedback circuit 16 is connected to the amplifier circuit 14 to reduce gain of the amplifier circuit when an RF voltage swing present at the input terminal of the non-linear feedback circuit 16 exceeds a predefined threshold. As used herein, the terms "non-linear feedback element" and "non-linear feedback circuit" may be used interchangeably, and may be referred to simply as "the feedback element" or "the feedback circuit" for brevity.

In the embodiment illustrated in FIG. 1, a multi-stage RF amplifier 10 comprises two stages 12, identified in FIG. 1 as "Stage 1" and "Stage 2," connected in series, i.e., the output of Stage 1 is connected to the input of Stage 2. FIG. 1 shows the subject matter of the present disclosure applied to a two-stage amplifier, but the same principle of operation may be applied to a single stage amplifier as well as to amplifiers having more than two stages.

In each stage 12, when the peak voltage at an output terminal OUT of the amplification circuit 14 exceeds a threshold set by the non-linear feedback element 16, a portion of the output signal OUT is fed back via the non-linear feedback element 16 to the input terminal IN of the amplification circuit 14, where it cancels some of the amplifier input signal, thus reducing the overall gain of the stage 12. In the embodiment illustrated in FIG. 1, each amplification circuit 14 is an inverting amplifier, so the signal output by the non-linear feedback element 16 will decrease, rather than increase, the signal being input into the amplification circuit 14. In an alternative embodiment, each amplification circuit 14 may be non-inverting amplifiers, in which case the non-linear feedback element 16 may include an inverter to invert the signal being input into the non-linear feedback element 16 or to invert the signal being output by the non-linear feedback element 16. In yet another embodiment, the amplification circuit 14 and the non-linear feedback element 16 may both be non-inverting (or both be inverting) but the output of the non-linear feedback element 16 may have sufficient phase delay such that, when joined with the input signal to the amplification circuit 14, the output of the non-linear feedback element 16 may reduce the voltage of the input signal to the amplification circuit 14. The feedback element 16 may detect and respond to excessive voltage, excessive current, excessive power, excessive heat, some other condition, or combinations of the above.

In one embodiment, if the output of any amplification circuit 14 exceeds a threshold value, the corresponding feedback element 16 operates to limit further increases of the output value, e.g., by limiting the input value. In another embodiment, the corresponding feedback element 16 may modify the bias conditions of the In another embodiment, the feedback element 16 may operate to not just limit further increases but rather to reduce the output to a lower value. In yet another embodiment, the feedback element 16 may respond to a threshold condition by shutting down or disabling the amplification circuit 14 altogether. In this manner the feedback element 16 can operate to prevent destruction of the amplification circuit 14, the stage 12, the multi-stage amplifier 10 as a whole, and possibly circuit elements downstream from the multi-stage amplifier 10.

It will be understood that a number of different configurations are possible. For example: the non-linear feedback element may be placed across one or several stages; the non-linear feedback element may be combined with conventional limiter elements before and after different stages; the non-linear feedback element can be combined with other limiting approaches such as approaches that reduce the amplifier bias voltage when the supply voltages exceeds a safe limit; each stage may have different non-linear feedback elements, or like elements with different values; one non-linear feedback element may connect to another non-linear feedback element and trigger that other feedback element. Feedback elements may be Direct Current (DC)-coupled or Alternating Current (AC)-coupled. AC-coupled elements are insensitive to supply voltages but require DC blocking capacitors, which take up die area. Some of these different configurations are discussed in more detail below.

Figure 2:
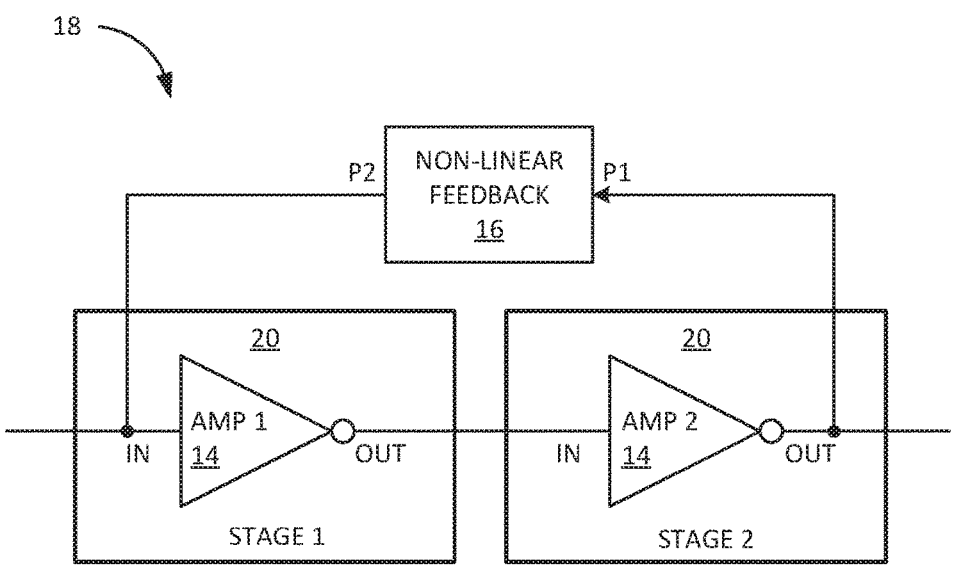
FIG. 2 is a diagram illustrating exemplary non-linear feedback applied across multiple stages of a multi-stage amplifier according to another embodiment of the present disclosure.

FIG. 2 is a diagram illustrating exemplary non-linear feedback applied across multiple stages of a multi-stage amplifier according to another embodiment of the present disclosure. FIG. 2 illustrates the principle that a non-linear feedback element 16 may span multiple stages. In one embodiment, an RF amplifier 18 comprises a plurality of amplification stages 20 connected in series, each stage 20 comprising an amplifier circuit 14 having an input terminal and an output terminal, wherein an input terminal of a subsequent amplification stage is connected to an output terminal of a prior amplification stage, and a non-linear feedback circuit having an input terminal and an output terminal. The input terminal of the non-linear feedback circuit is connected to an output terminal of one of the plurality of amplification stages and the output terminal of the non-linear feedback circuit is connected to the amplification circuit of a another of the plurality of amplification stages to reduce gain of the amplification circuit of the other amplification stage when an RF voltage swing present at the input terminal of the non-linear feedback circuit exceeds a predefined threshold.

In the embodiment illustrated in FIG. 2, a multi-stage amplifier 18 comprises two amplification stages 20, identified as "Stage 1" and "Stage 2," each stage 20 comprising the amplification circuit 14. The non-linear feedback circuit 16 accepts input from the output of Stage 2 and provides feedback to Stage 1. In this manner, the entire multi-stage amplifier 18 may be protected from dangerous or destructive conditions.

In the embodiment illustrated in FIG. 2, the output of the non-linear feedback circuit 16 is fed to the input terminal of the amplification circuit 14, but other configurations are possible. For example, as will be described below, the output of the non-linear feedback circuit 16 may control or be connected to a bias circuit for an amplification circuit 14 rather than being connected to a signal input of the amplification circuit 14. In the embodiment illustrated in FIG. 2, the output of a subsequent stage is fed back via the non-linear feedback circuit 16 to a prior stage, but other configurations are also contemplated, including, but not limited to, the configuration illustrated in FIG. 3.

Figure 3A:
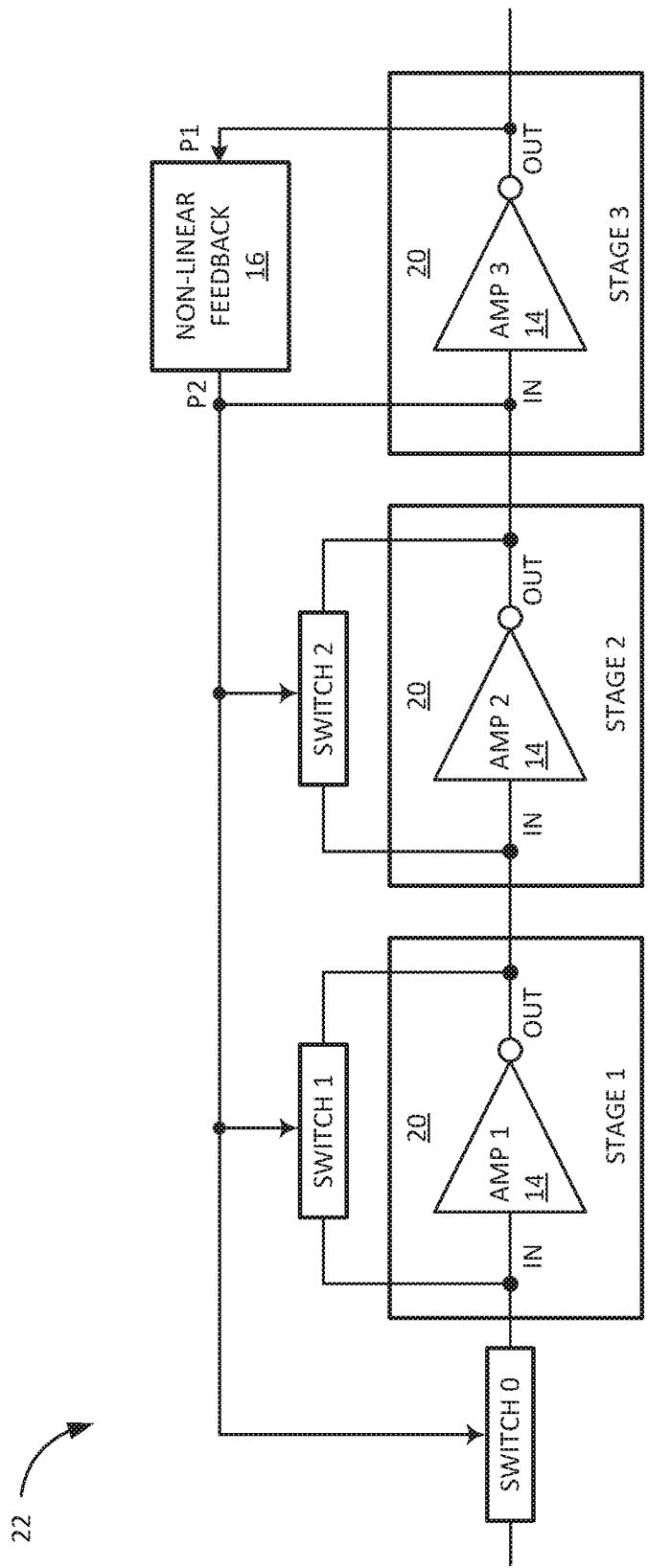
FIGS. 3A and 3B are diagrams illustrating exemplary non-linear feedback applied simultaneously to multiple stages of a multi-stage amplifier according to other embodiments of the present disclosure.
Figure 3B:
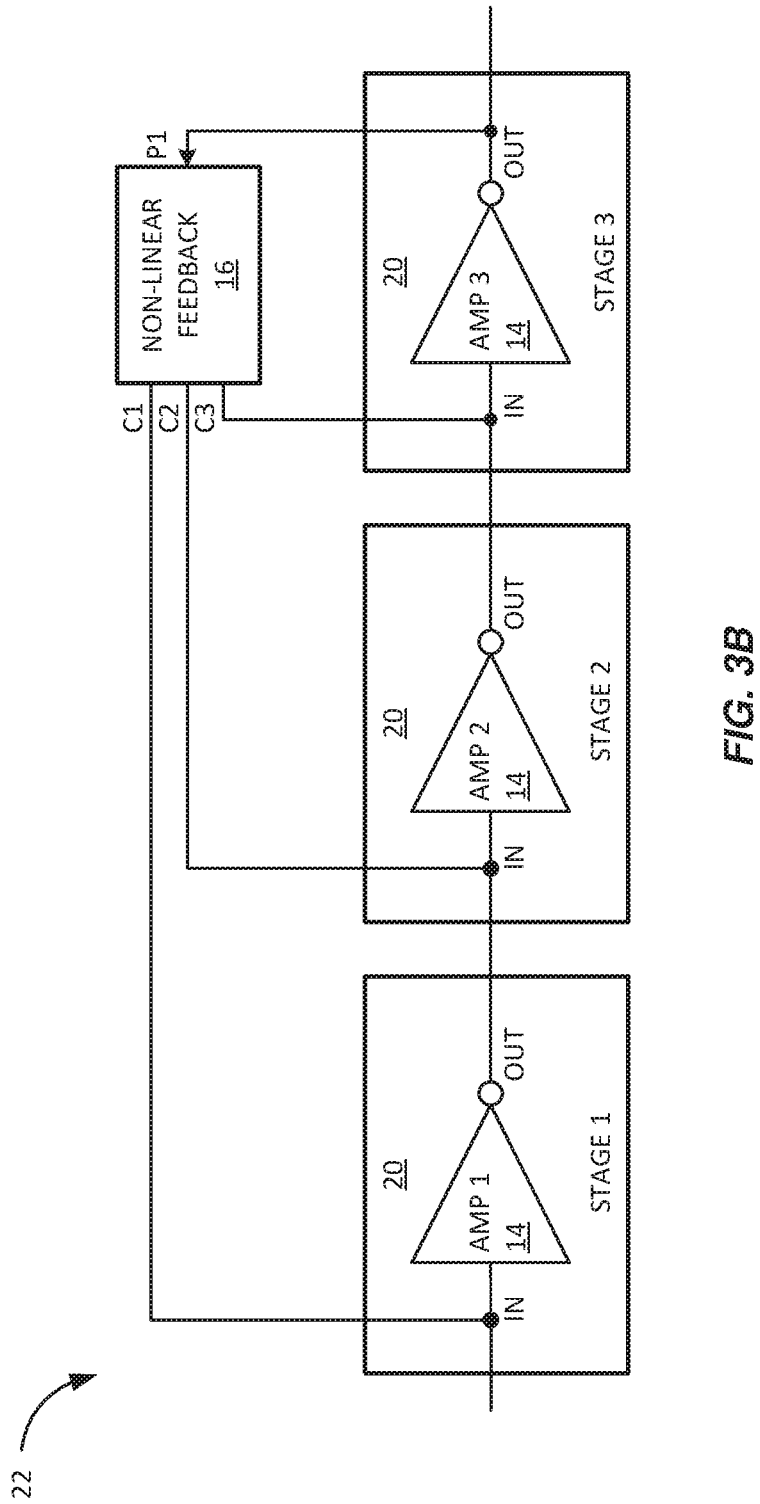

FIGS. 3A and 3B are diagrams illustrating exemplary non-linear feedback applied simultaneously to multiple stages of a multi-stage amplifier according to other embodiments of the present disclosure. In the embodiments illustrated in FIGS. 3A and 3B, a multi-stage amplifier 22 includes three of the amplification stages 20, identified as "Stage 1," "Stage 2," and "Stage 3," each stage 20 comprising the amplification circuit 14. The non-linear feedback circuit 16 accepts input from the output of a subsequent stage and provides feedback to the input of one or more of the stages.

In the embodiment illustrated in FIG. 3A, for example, the non-linear feedback circuit 16 receives its input from the output of Stage 3 of the multi-stage amplifier 22, and the output of the non-linear feedback circuit 16 is sent to the input terminal of Stage 3. In one embodiment, the output of the non-linear feedback circuit 16 is also sent to the control terminals of one or more switches, identified in FIG. 3A as "Switch 0," "Switch 1," and "Switch 2." In the embodiment illustrated in FIG. 3A, Switch 0 disconnects the input signal from Stage 1; Switch 1 connects the output of Stage 1 to the input of Stage 1, causing Stage 1 to become a unity gain amplifier; and Switch 2 connects the output of Stage 2 to the input of Stage 2, causing Stage 2 to become a unity gain amplifier. In alternative embodiments, only one (or some) of the switches may be implemented. In alternative embodiments, Switches 1 and 2 may create paths that include resistors or other circuit element that result in the respective amplifier having a reduced gain other than unity gain when the switch is activated. In other embodiments, a switch may tie the input of an amplifier to ground or other known voltage, e.g., which causes the respective amplifier to operate in a safe condition.

In the embodiment illustrated in FIG. 3B, for example, the non-linear feedback circuit 16 receives its input from the output of the Stage 3 of the multi-stage amplifier 22, and the control outputs of the non-linear feedback circuit 16, identified as C1, C2, and C3 are sent to the input terminals of the respective amplifiers 14 of each stage 20, e.g., to drive the input signals to a known or safe level. In an alternative embodiment, the output of the feedback circuit 16 may be sent to less than all of the stages 20. In yet another embodiment, the feedback circuit 16 may receive as input one or more signals from one or more of the stages 20.

Figure 4:
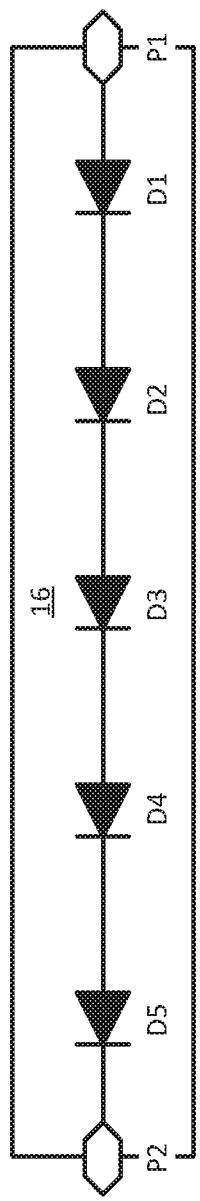
FIG. 4 is a diagram illustrating an exemplary Direct Current (DC)-coupled non-linear feedback circuit according to an embodiment of the present disclosure.

FIG. 4 is a diagram illustrating an exemplary DC-coupled non-linear feedback circuit according to an embodiment of the present disclosure. In the embodiment illustrated in FIG. 4, the feedback element 16 includes a DC-coupled diode stack. The chain of diodes D1 through D5 will not conduct until the voltage drop across the stack exceeds the collective diode turn-on voltage. Where a single diode has a turn-on voltage of one volt, for example, the diode stack illustrated in FIG. 4 would not become active until difference between the voltage present at P1 and the voltage present at P2 is equal to or greater than five volts, at which time the diode stack would begin to conduct. Any kind of diode or non-linear element can be used in the stack.

When the diode stack conducts, the voltage present at P1 (i.e., the output of the amplification circuit 14) would be fed to the input of the same (or a prior) amplification circuit 14. If the amplification circuit 14 has a gain greater than one volt, the feedback voltage provided by the feedback circuit 16 could be quite large in comparison to the voltage present at the input of the amplification circuit 14. In this scenario, the effect of the feedback element 16 is to quickly and strictly limit the output voltage of the amplification circuit 14—and the input voltage appearing at input terminal P1 of feedback circuit 16—to the turn-on voltage of the diode stack, e.g., five volts.

Figure 5:
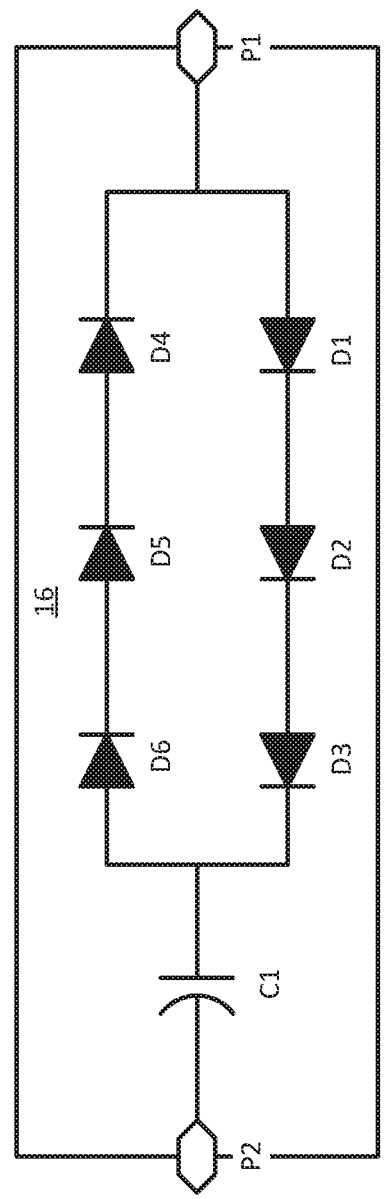
FIG. 5 is a diagram illustrating an exemplary Alternating Current (AC)-coupled non-linear feedback circuit according to another embodiment of the present disclosure.

FIG. 5 is a diagram illustrating an exemplary AC-coupled non-linear feedback circuit according to another embodiment of the present disclosure. In the embodiment illustrated in FIG. 5, the feedback element 14 includes an AC-coupled diode stack. In the embodiment illustrated in FIG. 5, a first chain of diodes D1 through D3 provides a first diode stack that conducts in one direction when the voltage difference $(V_{P1}-V_{P2})$ exceeds the combined turn-on voltage of that diode stack. A second stack of diodes D4 through D6 conducts in the opposite direction when the voltage difference $(V_{P2}-V_{P1})$ exceeds the combined turn-on voltage of the second stack. The combined turn-on voltage of the first stack may or may not be the same as the combined turn-on voltage of the second stack. In the embodiment illustrated in FIG. 5, the feedback circuit is AC-coupled: a capacitor C1 provides isolation from a DC bias. In contrast, the feedback circuit in FIG. 4 is DC-coupled: there is no capacitor to provide isolation from a DC bias.

Figure 6:
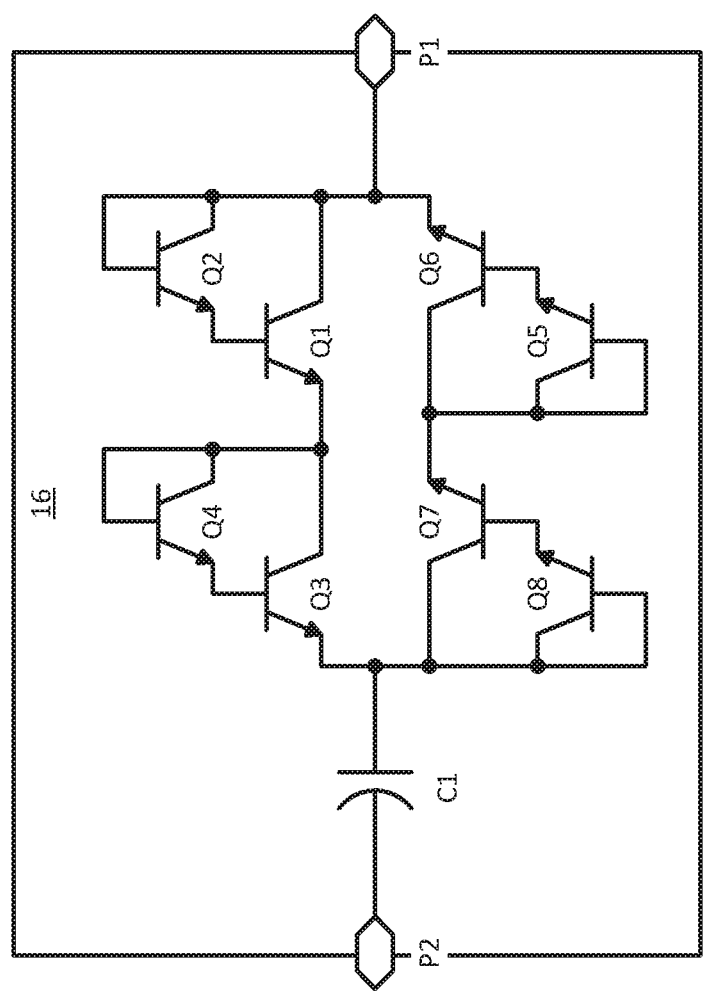
FIG. 6 is a diagram illustrating an exemplary AC-coupled non-linear feedback circuit according to another embodiment of the present disclosure.

FIG. 6 is a diagram illustrating an exemplary AC-coupled non-linear feedback circuit according to another embodiment of the present disclosure. In the embodiment illustrated in FIG. 6, the feedback circuit 16 includes an AC-coupled Darlington-connected diode stack. Bipolar Junction Transistors (BJTs) Q1 and Q2 form one Darlington-connected diode, Q3 and Q4 form a second Darlington-connected diode, Q5 and Q6 form a third Darlington-connected diode, and Q7 and Q8 form a fourth Darlington-connected diode. The operation of this feedback circuit is similar to the operation of the feedback circuit illustrated in FIG. 5, except that, in FIG. 6, the threshold voltages are defined by the Darlington-connected diodes, rather than by the P-N junction diodes shown in FIG. 5. The number of Darlington-connected diodes determines the clamp voltage. The Darlington-connected diodes and AC-coupled configuration are effective at avoiding false triggering due to high supply voltages.

Figure 7:
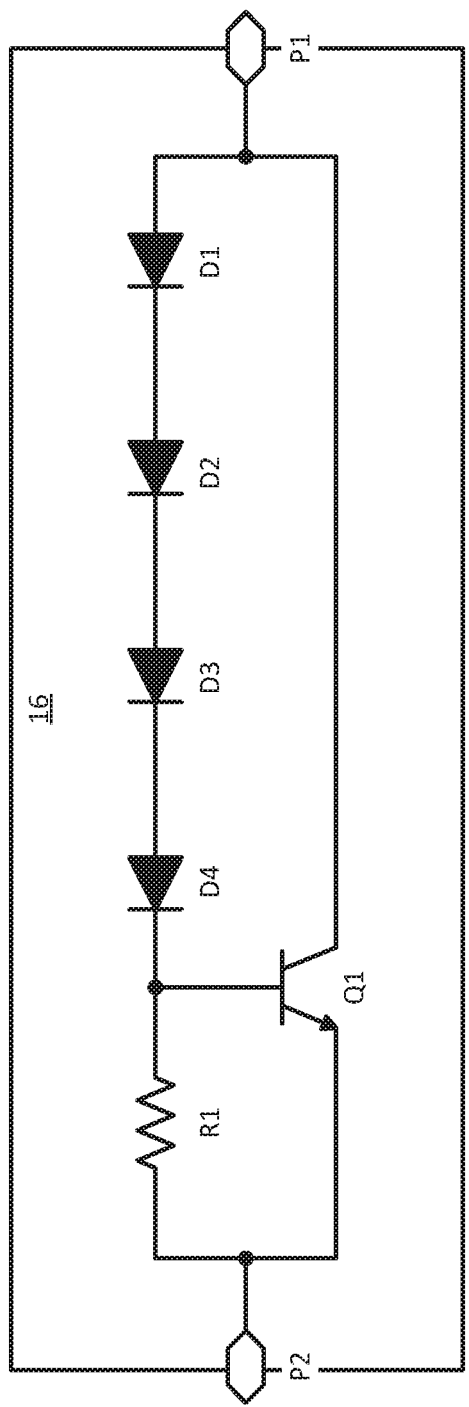
FIG. 7 is a diagram illustrating an exemplary DC-coupled non-linear feedback circuit according to another embodiment of the present disclosure.

FIG. 7 is a diagram illustrating an exemplary DC-coupled non-linear feedback circuit 16 according to another embodiment of the present disclosure. In the embodiment illustrated in FIG. 7, the feedback circuit 16 comprises a DC-coupled feedback element in which a diode stack made up of diodes D1 through D4 and a resistor R1 set a trigger voltage for the transistor Q1. Once the voltage ($V_{P1}-V_{P2}$) exceeds that trigger voltage, transistor Q1 conducts, providing feedback to the input terminal of the amplification circuit 14 to which the feedback circuit 16 output is connected. In this circuit, the base voltage for Q1 may be connected to a feedback element in another stage.

Figure 8:
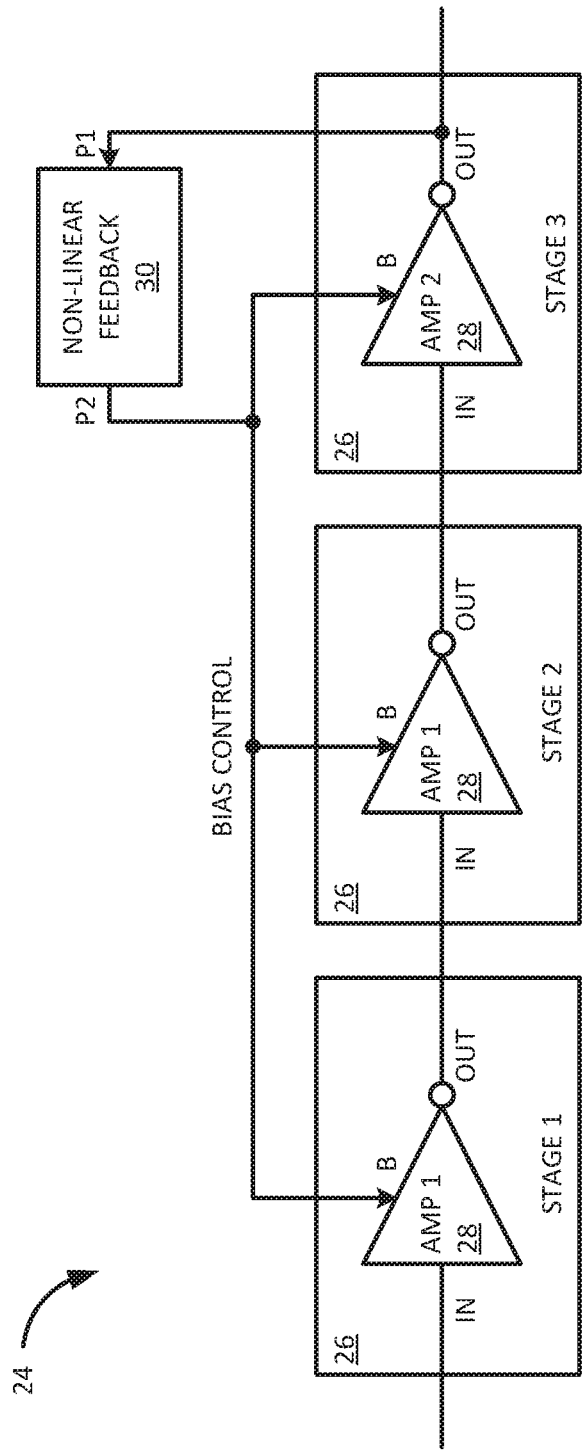
FIG. 8 is a diagram illustrating exemplary non-linear feedback applied simultaneously to control the bias circuits of multiple stages of a multi-stage amplifier according to another embodiment of the present disclosure.

FIG. 8 is a diagram illustrating exemplary non-linear feedback applied simultaneously to control the bias circuits of multiple stages of a multi-stage amplifier according to another embodiment of the present disclosure. In the embodiment illustrated in FIG. 8, a multi-stage amplifier 24 comprises multiple stages 26, identified as "Stage 1," "Stage 2," and "Stage 3," each stage having an amplifier 28 with an input terminal IN, an output terminal OUT, and a bias control terminal B. A non-linear feedback circuit 30 detects a threshold condition present at the output of the amplifier 28 of the Stage 3, and responds by sending a signal to the bias control terminals of one or more of the stages 26. In the embodiment illustrated in FIG. 8, for example, the feedback circuit 30 sends a signal to the bias control terminals of all of the stages within the multi-stage amplifier 24, but other configurations are contemplated and within the scope of the subject matted described herein.

In the embodiment illustrated in FIG. 8, the non-linear feedback circuit 30 responds to detection of a threshold condition by manipulating the bias condition of one or more of the amplifiers 28 rather than manipulating the input signal into one or more of the amplifiers 14, as is done in FIGS. 1 and 2.

Figure 9:
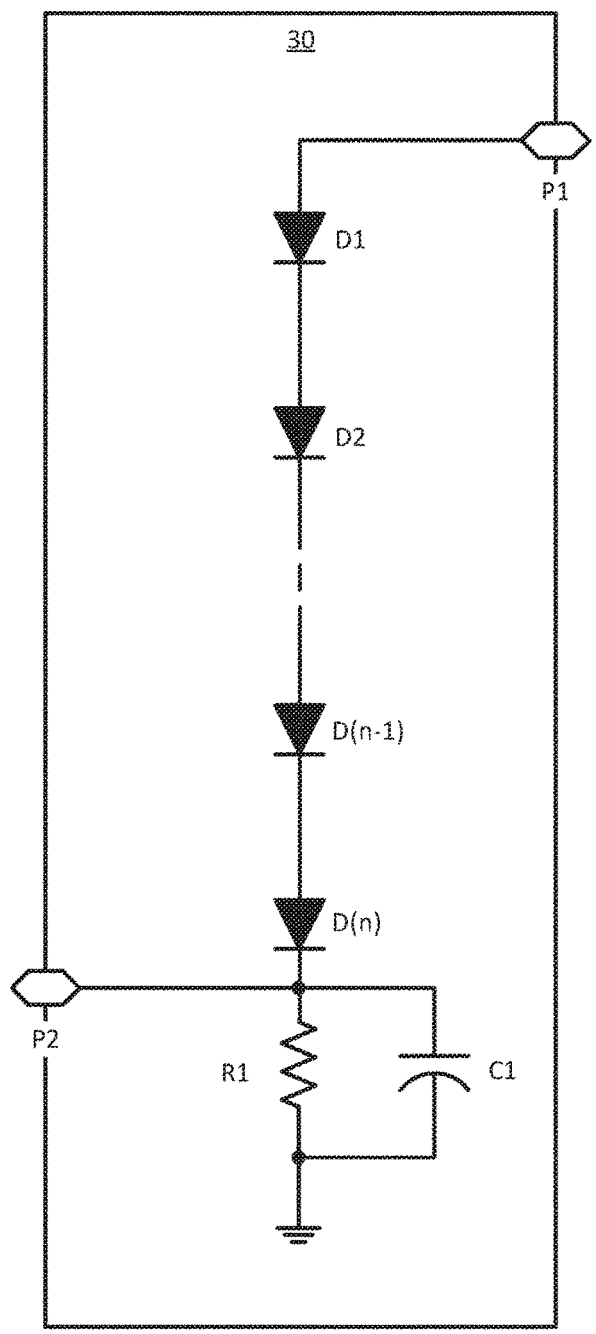
FIG. 9 is a diagram illustrating an exemplary non-linear feedback circuit for controlling the bias of a stage of an amplifier according to an embodiment of the present disclosure.

FIG. 9 is a diagram illustrating an exemplary non-linear feedback circuit 30 for controlling the bias of the amplifier 28 within one or more of the stages 26 of a multi-stage amplifier 24 according to an embodiment of the present disclosure. In the embodiment illustrated in FIG. 9, the non-linear feedback circuit 30 includes a diode stack comprising a series of diodes D1 through D(n), a resistor R1, and a capacitor C1. The resistor R1 and diode stack determine the threshold voltage that must be present between an input terminal P1 and a ground before the diode stack begins to conduct. Once the diode stack begins to conduct, a current through resistor R1 will create voltage to be present at an output terminal P2. This voltage is fed to the bias control input of one or more of the amplifiers 28.

Figure 10:
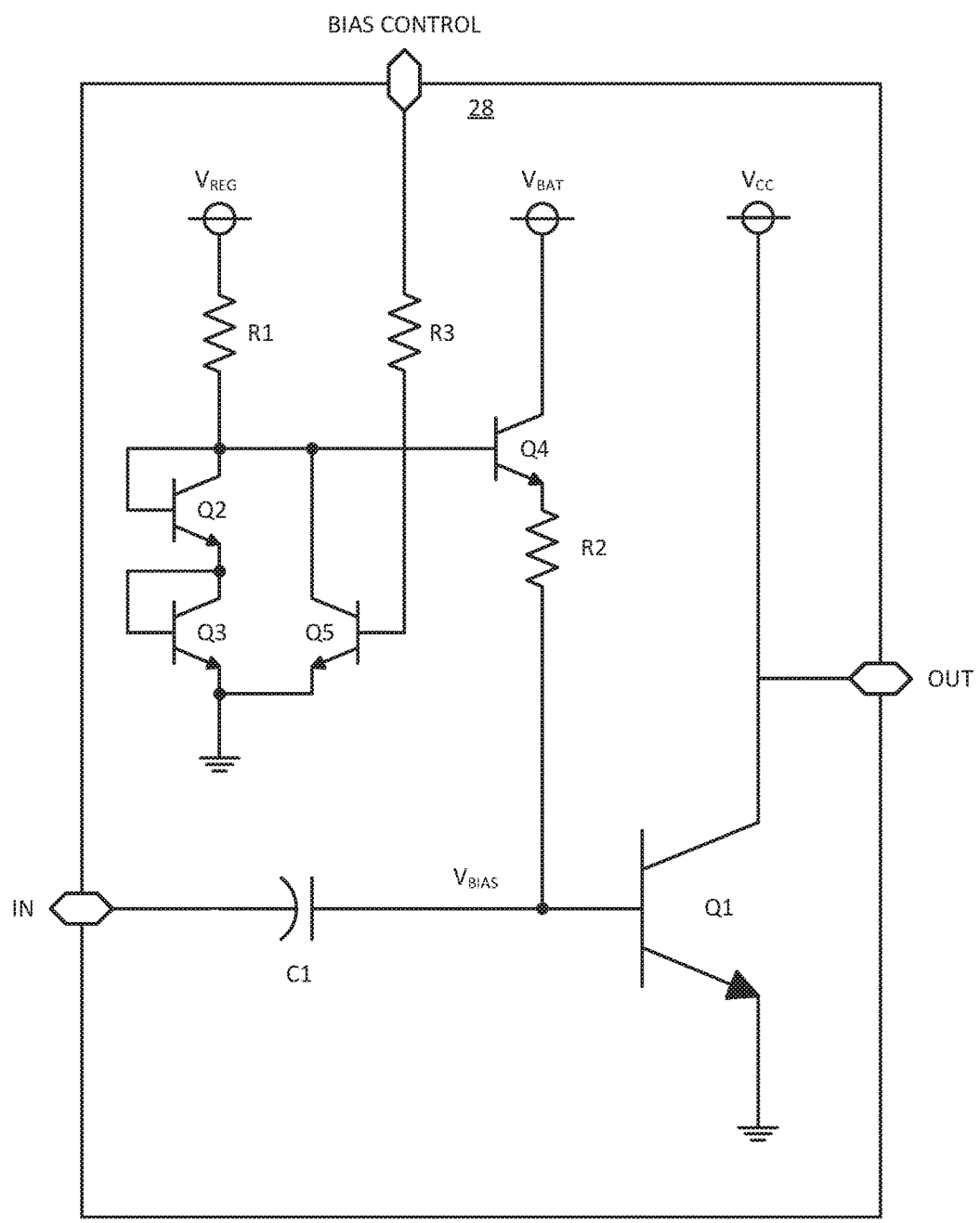
FIG. 10 is a diagram illustrating an exemplary amplifier stage with bias control according to an embodiment of the present disclosure.

FIG. 10 is a diagram illustrating the exemplary stage amplifier 28 with bias control according to an embodiment of the present disclosure. In the embodiment illustrated in FIG. 10, the amplifier 28 includes a main BJT transistor Q1, which is AC-coupled via the capacitor C1 to the input signal provided to the input terminal IN and which provides an amplified signal at output terminal OUT. Transistors Q2, Q3, and Q4, along with resistors R1 and R2, comprise a bias circuit that provides a bias voltage $V_{BIAS}$ to the base of Q1. A bias control input terminal is connected to transistor Q5 via resistor R3. Voltage sources $V_{REG}$, $V_{BAT}$, and $V_{CC}$ are shown as idealized voltage supplies. When the bias control input voltage exceeds a threshold (i.e., the bias control signal becomes active), the transistor Q5 turns on, which drives the voltage at the base of the transistor Q4 to the ground, turning Q4 off. As a result, the $V_{BIAS}$ drops, which turns off Q1 and protects it from dangerous or destructive overvoltage conditions.

The approach of the present disclosure has advantages compared with the conventional limiter approach, especially when applied to a power amplifier. A conventional limiter at the output of a power amplifier must have a very low impedance to compete with the low amplifier output impedance. To obtain that low impedance, large devices are needed in the limiter design. With the feedback approach, only a fraction of the amplifier output signal needs to be coupled back to the amplifier input, meaning that the feedback element can use smaller size devices. In addition, all the non-linear elements can also have one end connected to ground, in which case they serve as voltage limiters.

For all the different implementations of the feedback elements, the number of series elements must be designed such that there is no feedback during normal operation and strong feedback in overvoltage conditions. For the DC-coupled variants, modulation peaks at high supply voltage may trigger the feedback element, which is undesired. In this case, the stack height must be increased. For the AC-coupled variants, it is possible to use a low stack height at nodes with low nominal voltage swings.

TABLE 1

| Amplifier Configuration | Test Result |
| --- | --- |
| No protection | Fails Vcc = 3.4 V |
| Final stage protected by circuit in FIG. 6 | Passes Vcc = 5.1 V |

Table 1, above, shows results for a ruggedness test in which the amplifier supply voltage is swept from 3.4 V to 5.1 V, the load Voltage Standing Wave Ratio (VSWR) is 7:1, and the load phase is swept across all phase angles. The feedback circuits of the present disclosure protect the amplifier from destruction even at high supply voltages. Without that circuit, the test fails at nominal supply voltage. In the conditions of the test described above, it was found that having the feedback around multiple stages was required to meet the requirements.

Those skilled in the art will recognize improvements and modifications to the present disclosure. All such improvements and modifications are considered within the scope of the concepts disclosed herein.

The invention claimed is:

1. A Radio Frequency (RF) amplifier, comprising:
an amplifier circuit having an input terminal and an output terminal; and
a non-linear feedback circuit having an input terminal and an output terminal, the input terminal of the non-linear feedback circuit being coupled to the output terminal of the amplifier circuit and the output terminal of the non-linear feedback circuit being coupled to a bias circuit of the amplifier circuit to reduce gain of the amplifier circuit when an RF voltage swing present at the input terminal of the non-linear feedback circuit exceeds a predefined threshold;
wherein:
the non-linear feedback circuit comprises a plurality of non-linear elements in series or a stack; and
the predefined threshold is provided by the plurality of non-linear elements.

2. The RF amplifier of claim 1 wherein the non-linear feedback circuit operates to limit output of the amplifier circuit to a maximum RF voltage swing, operates to reduce the gain of the amplifier circuit to zero, or operates to turn the amplifier circuit off.

3. The RF amplifier of claim 1 wherein the output terminal of the non-linear feedback circuit is coupled to the input terminal of the amplifier circuit.

4. The RF amplifier of claim 1 wherein the non-linear feedback circuit comprises a diode branch comprising at least one diode or diode-connected Bi-polar Junction Transistor (BJT) or Field-Effect Transistor (FET).

5. The RF amplifier of claim 4 wherein the non-linear feedback circuit provides feedback via the output terminal of the non-linear feedback circuit when the RF voltage swing present at the input terminal of the non-linear feedback circuit exceeds a turn-on voltage of the diode branch.

6. The RF amplifier of claim 1 wherein the non-linear feedback circuit is Alternating Current (AC)-coupled to the amplifier circuit.

7. The RF amplifier of claim 1 wherein the non-linear feedback circuit is Direct Current (DC)-coupled to the amplifier circuit.

8. A Radio Frequency (RF) amplifier, comprising:
a plurality of amplification stages connected in series, each stage comprising an amplifier circuit having an input terminal and an output terminal, wherein an input terminal of a subsequent amplification stage is coupled to an output terminal of a prior amplification stage; and
a non-linear feedback circuit having an input terminal and an output terminal, the input terminal of the non-linear feedback circuit being coupled to an output terminal of one of the plurality of amplification stages and the output terminal of the non-linear feedback circuit being coupled to an input terminal of another of the plurality of amplification stages to reduce gain of the amplification circuit of the other amplification stage when an RF voltage swing present at the input terminal of the non-linear feedback circuit exceeds a predefined threshold;
wherein the non-linear feedback circuit reduces the gain of the amplification circuit of the other amplification stage to zero or turns the amplifier circuit of the other amplification stage off.

9. The RF amplifier of claim 8 wherein the non-linear feedback circuit limits output of the RF amplifier to a maximum RF voltage swing.

10. The RF amplifier of claim 8 wherein the output terminal of the non-linear feedback circuit controls a switch coupled to the input terminal of one of the plurality of amplification stages.

11. The RF amplifier of claim 10 wherein the switch operates to electrically isolate the input terminal of the amplification stage.

12. The RF amplifier of claim 10 wherein the switch operates to electrically couple the input terminal of the amplification stage to the output terminal of the amplification stage.

13. The RF amplifier of claim 8 wherein another output terminal of the non-linear feedback circuit is coupled to the input terminal of another one of the plurality of amplification stages.

14. The RF amplifier of claim 8 wherein the output terminal of the non-linear feedback circuit is coupled to a bias circuit of the other amplification stage.

15. The RF amplifier of claim 8 wherein the non-linear feedback circuit comprises a diode branch comprising at least one diode or diode-connected Bi-polar Junction Transistor (BJT) or Field-Effect Transistor (FET).

16. The RF amplifier of claim 15 wherein the non-linear feedback circuit provides feedback via the output terminal of the non-linear feedback circuit when the RF voltage swing present at the input terminal of the non-linear feedback circuit exceeds a turn-on voltage of the diode branch.

17. The RF amplifier of claim 8 wherein the non-linear feedback circuit is Alternating Current (AC)-coupled to the amplifier circuit.

18. The RF amplifier of claim 8 wherein the non-linear feedback circuit is Direct Current (DC)-coupled to the amplifier circuit.

19. The RF amplifier of claim 8 wherein the output terminal of the non-linear feedback circuit is coupled to a plurality of the plurality of amplification stages.

20. The RF amplifier of claim 8 wherein the output terminal of the non-linear feedback circuit is coupled to all stages of the plurality of amplification stages.

21. The RF amplifier of claim 8 wherein the non-linear feedback circuit comprises a plurality of input terminals being coupled to output terminals of the plurality of amplification stages.

22. The RF amplifier of claim 1, wherein the plurality of non-linear elements is chosen from a group consisting of a diode, a diode-connected Bi-polar Junction Transistor (BJT), or a Field-Effect Transistor (FET).

* * * * *